US012671222B2

(12) United States Patent
Herzog

(10) Patent No.: US 12,671,222 B2
(45) Date of Patent: Jun. 30, 2026

(54) BEAM SHUTTER, LASER ARRANGEMENT AND ASSOCIATED OPERATING METHOD

(71) Applicant: TRUMPF Schweiz AG, Grüsch (CH)

(72) Inventor: Teja Herzog, Landquart (CH)

(73) Assignee: TRUMPF Schweiz AG, Grüsch (CH)

( * ) Notice: Subject to any disclaimer, the term of this patent is extended or adjusted under 35 U.S.C. 154(b) by 990 days.

(21) Appl. No.: 17/887,664

(22) Filed: Aug. 15, 2022

(65) Prior Publication Data

US 2022/0407280 A1  Dec. 22, 2022

Related U.S. Application Data

(63) Continuation of application No. PCT/EP2020/081951, filed on Nov. 12, 2020.

(30) Foreign Application Priority Data

Nov. 14, 2019  (EP) ...................................... 19209188

(51) Int. Cl.
*H01S 3/00* (2006.01)
*G01R 33/07* (2006.01)
*G02B 26/08* (2006.01)

(52) U.S. Cl.
CPC .......... *H01S 3/0071* (2013.01); *G01R 33/072* (2013.01); *G02B 26/0816* (2013.01)

(58) Field of Classification Search
CPC . H01S 3/0071; G01R 33/072; G02B 26/0816; G02B 26/02; G01K 7/38
See application file for complete search history.

(56) References Cited

U.S. PATENT DOCUMENTS 5,596,590 A   1/1997  de Ruyter et al.
6,710,337 B2  3/2004  Engelhardt
(Continued)

FOREIGN PATENT DOCUMENTS

DE   4127421 A1    1/1993
DE   69616501 T2   5/2002
(Continued)

OTHER PUBLICATIONS

Translation of DE 102020203203-A1.*

*Primary Examiner* — Xinning(Tom) Niu
(74) *Attorney, Agent, or Firm* — Laurence A. Greenberg; Werner H. Stemer; Ralph E. Locher

(57) ABSTRACT

A beam shutter for a laser beam includes a main body, a magnetic field sensor, a holding arm having release and closure positions, a reflecting optical unit and a permanent magnet producing a magnetic field having reduced strength upon heating above a limit temperature. The magnet is closer to the sensor in the closure than the release position. A controller deactivates a laser light source at reduced magnetic field measured by the sensor, when passing a predefined strength and/or gradient magnetic field threshold. A laser arrangement includes a laser light source and beam shutter. The laser beam strikes the reflecting unit in the closure position. An operating method includes bringing the holding arm into closure position, operating the laser light source, measuring magnetic field strength and/or gradient using the sensor, deactivating the laser light source when the magnetic field drops and passes the predefined magnetic field threshold.

21 Claims, 5 Drawing Sheets

(56)                    References Cited

U.S. PATENT DOCUMENTS

|  9,671,676 | B2 |   | 6/2017 | Agapescu |  |
| 10,018,830 | B1 |   | 7/2018 | Woodruff |  |
| 10,027,181 | B2 |   | 7/2018 | Fischer et al. |  |
| 2002/0024714 | A1 | * | 2/2002 | Sandstrom | G02B 26/0833 |
|  |  |  |  |  | 359/290 |
| 2003/0019937 | A1 |   | 1/2003 | Colley et al. |  |
| 2004/0249507 | A1 | * | 12/2004 | Yoshida | H01L 21/67265 |
|  |  |  |  |  | 700/245 |
| 2007/0159677 | A1 |   | 7/2007 | Doering et al. |  |
| 2009/0011614 | A1 | * | 1/2009 | Bruland | B23K 26/0624 |
|  |  |  |  |  | 257/E23.15 |
| 2009/0019937 | A1 |   | 1/2009 | Deemer et al. |  |
| 2014/0353920 | A1 |   | 12/2014 | Gupta et al. |  |

FOREIGN PATENT DOCUMENTS

| DE | 10029444 | A1 |   | 1/2004 |  |
| DE | 102004008326 | A1 |   | 9/2005 |  |
| DE | 102016101231 | B4 |   | 7/2017 |  |
| DE | 102020203203 | A1 | * | 9/2021 | H02K 11/215 |
| EP | 0899595 | A2 |   | 3/1999 |  |
| JP | S5763240 | U |   | 4/1982 |  |
| WO | 9116652 | A1 |   | 10/1991 |  |
| WO | WO-03048835 | A2 | * | 6/2003 | B23K 26/06 |
| WO | 2011022769 | A1 |   | 3/2011 |  |
| WO | 2014082073 | A1 |   | 5/2014 |  |
| WO | 2017059071 | A1 |   | 4/2017 |  |

* cited by examiner

Laser Light Source

Control Unit

BEAM SHUTTER, LASER ARRANGEMENT AND ASSOCIATED OPERATING METHOD

CROSS-REFERENCE TO RELATED APPLICATION

This application is a continuation, under 35 U.S.C. § 120, of copending International Patent Application PCT/EP2020/081951, filed Nov. 12, 2020, which designated the United States; this application also claims the priority, under 35 U.S.C. § 119, of European Patent Application EP 19209188.2, filed Nov. 14, 2019; the prior applications are herewith incorporated by reference in their entirety.

FIELD AND BACKGROUND OF THE INVENTION

The invention relates to a beam shutter for a laser beam, a laser arrangement having a laser light source and a beam shutter, and a method for operating a laser arrangement.

In laser arrangements having a laser light source for generating a laser beam known from the prior art it is often provided that upon opening of a safety circuit (for example interruption of a light barrier or opening of a housing), a reflecting optical unit is folded into the beam path of the laser beam. The reflecting optical unit then interrupts the path of the laser beam to an outlet opening. The laser beam is deflected by the reflecting optical unit and is typically incident on an absorber.

It can sometimes occur in such devices that the reflecting optical unit detaches from a holding device. At low laser powers, the passive safety of the material of the holding device on which the reflecting optical unit is fixed is sufficient to ensure that even upon loss of the optical unit, the laser beam still continues to be interrupted. At high laser powers, in contrast, the holding device cannot continuously withstand the beam without the reflecting optical unit. Securely preventing the exit of the laser beam is then no longer ensured. However, it is very difficult to reliably detect an absence of the optical unit.

Alternatively, in particular at high laser powers, a reflecting optical unit can be used for active decoupling of laser radiation. The reflecting optical unit is folded into the laser beam in this case when laser light is to be emitted. When the reflecting optical unit is not folded into the beam path, the laser beam is incident directly on an absorber. A loss of the reflecting optical unit therefore no longer means a loss of the laser safety. If the optical unit is absent and the laser burns through a holding device of the reflecting optical unit, the beam is thus incident on the absorber which withstands the laser power. However, in the case of active decoupling of the laser beam, a very high level of accuracy is necessary in the positioning of the reflecting optical unit in the beam path, since the laser beam always has to be deflected by this moving optical unit upon decoupling, for example for the purpose of processing using the laser beam.

A beam shutter having a mirror for decoupling a laser beam is known from European Patent Application EP 0 899 595 A2. The mirror is disposed on a linearly movable holding device. The holding device has a coil to move the holding device in relation to fixed bar magnets when a current flows through the coil. In order to be able to control deceleration of the holding device before reaching two end stops, a steel wing is disposed on the holding device, which interacts with two Hall effect switches, which can be disposed 3 mm in front of the respective end positions of the holding device.

A light protection shutter for optical devices, for example a microscope, is known from German Patent Application DE 10 2004 008 326 A1, corresponding to U.S. Patent Application Publication No. 2007/0159677 A1. The light protection shutter has a shutter element connected to a motor shaft of a stepping motor for opening and closing an aperture opening of a fastening unit. An end position sensor can be provided on the fastening unit to ascertain the location of the shutter element.

German Patent DE 10 2016 101 231 B4, corresponding to U.S. Pat. No. 10,018,830 B1, describes a broadband laser shutter including a black diamond absorber plate, which is held in a ferromagnetic frame, through the use of which the absorber plate is movable in a sliding manner on a heatsink block. Two fixed wires and a wire movable with the frame can be provided for position feedback.

A shutter for a light beam is known from International Publication WO 91/16652 A1, corresponding to U.S. Pat. No. 5,032,005, which includes a flexible leaf made of ferromagnetic material. In a first position, the leaf is pulled by a magnet against a stop, so that the leaf deflects the light beam into a light trap. The leaf is pulled away from the stop by an electromagnet to release the light beam.

German Patent Application DE 100 29 444 A1 describes a shutter for a light beam of a laser light source, which has two components movable in opposite directions for interrupting the light beam. A passage for a light beam of a light barrier can be formed in each of the components for function monitoring.

A scanning mechanism for a barcode scanner is known from U.S. Patent Application Publication No. 2009/019937 A1. The scanning mechanism has a mirror assembly having a mirror mount and a mirror surface. The mirror mount is pivotably mounted. A magnet can be disposed on the mirror mount. The magnet can interact with a Hall sensor to enable a position or speed detection.

International Publication WO 03/048835 A2, corresponding to U.S. Pat. No. 6,762,866, describes a mechanical laser shutter having a reflective plate, which either lets through a laser beam or deflects it onto an absorber in a blocking position. Optical sensors can be provided for detecting the position of the shutter.

A measuring system for monitoring a ball bearing is known from U.S. Patent Application Publication No. 2014/0353920 A1. The measuring system has a permanent magnet which is fastened on the ball bearing. A magnetic field of the permanent magnet decreases as a function of the temperature. An evaluation circuit of the measuring system is configured to receive signals from a magnet sensor. The evaluation circuit can be configured to generate alarm signals if the detected temperature exceeds a limiting value.

SUMMARY OF THE INVENTION

It is accordingly an object of the invention to provide a beam shutter, a laser arrangement and an associated operating method, which overcome the hereinafore-mentioned disadvantages of the heretofore-known devices of this general type and which enable safe operation of a laser light source having great power, in particular a reliable interruption of a laser beam.

These objects are achieved by a beam shutter, a laser arrangement and an operating method recited in the claims. The respective dependent claims and the description indicate advantageous embodiments and variants.

With the foregoing and other objects in view there is provided, in accordance with the invention, a beam shutter for a laser beam. The beam shutter can also be referred to as a shutter. The beam shutter has a main body. A first magnetic field sensor is disposed on the main body. The beam shutter furthermore has a holding arm which can be brought relative to the main body into a release position and a closure position. A reflecting optical unit for deflecting the laser beam and a permanent magnet are disposed on the holding arm. The permanent magnet is typically disposed spaced apart from the reflecting optical unit on the holding arm. The permanent magnet and the reflecting optical unit are preferably disposed at opposite end regions of the holding arm. The permanent magnet generates a magnetic field, the strength of which decreases upon heating of the permanent magnet above a first limiting temperature. In the closure position of the holding arm, the permanent magnet is disposed closer to the first magnetic field sensor than in the release position of the holding arm. In the closure position of the holding arm, the permanent magnet is preferably disposed as close as possible to the first magnetic field sensor. The permanent magnet can be formed, for example, of neodymium-iron-boron. The beam shutter has a control unit which is configured to switch off a laser light source if, upon a decrease of the magnetic field measured by the first magnetic field sensor, a predetermined threshold value with respect to the strength and/or the gradient of the magnetic field is passed.

When the holding arm is in the closure position and the permanent magnet has not been heated above the first limiting temperature, the first magnetic field sensor recognizes on the basis of the strength of the magnetic field generated by the permanent magnet that the beam shutter is in a state in which a laser beam can be securely stopped.

The permanent magnet is fundamentally thermally coupled to the reflecting optical unit or a receptacle section of the holding arm for the reflecting optical unit via the holding arm. If the reflecting optical unit should be lost or should otherwise suffer a defect, the laser beam heats the holding arm. The heating of the holding arm is transferred to the permanent magnet. Upon heating beyond the first limiting temperature, the strength of the magnetic field generated by the permanent magnet decreases. Upon exceeding of the first limiting temperature, in other words, a temporary (reversible) or permanent change of the magnetization of the permanent magnet results in a decreasing sensor signal of the first magnetic field sensor. If the first magnetic field sensor recognizes that the magnetic field detected thereby does not reach a minimum strength, this means that either the holding arm is located in the release position or that the holding arm was excessively heated. This information can be used by the control unit to prompt switching off of a laser light source in order to bring about a safe state. A hazardous failure can be avoided in that in case of hazard or fault a signal loss or a signal decrease (and not a signal increase) is established. The functional principle of the beam shutter according to the invention is therefore intrinsically safe. The beam shutter according to the invention in particular enables contactless and wear-free monitoring of the safe closure of the beam path for the laser beam.

The first magnetic field sensor is typically configured to measure a strength of a magnetic field. Alternatively or additionally, the first magnetic field sensor can be configured to measure a chronological and/or spatial gradient of the strength of a magnetic field. The first magnetic field sensor can be an inductive sensor.

The reflecting optical unit is preferably made highly reflective. In particular, the reflecting optical unit can be configured to reflect at least 98%, preferably at least 99%, particularly preferably at least 99.5% of the laser light incident thereon of a laser light source of a laser arrangement having the beam shutter.

The holding arm is typically manufactured from a material which maintains its shape even at high temperatures and interrupts the laser beam even without the reflecting optical unit. The first limiting temperature of the permanent magnet is typically significantly, in particular at least 200 K, below a temperature at which the holding arm begins to deform.

The permanent magnet is preferably configured so that the magnetic field generated by the permanent magnet completely disappears upon heating of the permanent magnet above a second limiting temperature. The second limiting temperature is greater than or equal to the first limiting temperature. If the second limiting temperature is greater than the first limiting temperature, there is a decreasing range of the magnetic field between the first and the second limiting temperature. If the second limiting temperature is equal to the first limiting temperature, the strength of the magnetic field decreases suddenly upon exceeding of the two limiting temperatures. The second limiting temperature is in particular a Curie temperature of the permanent magnet. The second limiting temperature of the permanent magnet is fundamentally below the melting temperature of a material of the holding arm, preferably at least 200 K, particularly preferably at least 300 K, very particularly preferably at least 400 K. It can thus be ensured that the permanent magnet loses its magnetization before the holding arm begins to melt.

The holding arm particularly preferably is formed of CuCr1Zr. This material has still maintained the shape and interrupted the laser beam in bombardment tests using laser beams even at very high temperatures, in particular several hundred kelvin above the Curie temperature of typical permanent magnets.

It can be provided that the holding arm is pre-tensioned into the closure position, in particular through the use of a pre-tensioning element. The pre-tensioning element can be a spring element. Due to the pre-tensioning, the holding arm can pass automatically into the closure position when it is not actively brought into the release position by a drive. This increases the safety for the case of a defect or failure of the drive.

A stop can be provided for the holding arm. The stop can in particular define the closure position or prevent bringing the holding arm beyond the closure position. Together with a pre-tension, the passage of the holding arm into the closure position can be made even safer by the stop.

The holding arm can be rotatably mounted on the main body. A pivot mount can be configured particularly simply. The holding arm can thus be pivoted between the closure position and the release position. An electric motor, in particular a stepping motor, can be provided for rotating/pivoting the holding arm. In particular, the holding arm can be fastened on a shaft of the electric motor. A particularly simply constructed beam shutter is obtained in this way.

The reflecting optical unit can have a mirror. The mirror is preferably adhesively bonded to the holding arm. This simplifies the manufacturing of the beam shutter.

The first magnetic field sensor is advantageously configured as a Hall sensor. A Hall sensor permits a reliable and precise measurement of a magnetic field acting thereon. Alternatively or additionally, the first magnetic field sensor can utilize a magnetoresistive effect.

It is particularly preferably provided that a second magnetic field sensor is disposed on the main body. In the release position of the holding arm, the permanent magnet is disposed closer to the second magnetic field sensor than in the closure position of the holding arm. In the release position of the holding arm, the permanent magnet is preferably disposed as close as possible to the second magnetic field sensor. It can be recognized by the second magnetic field sensor whether the holding arm is located in the release position. Therefore, for the case in which the first magnetic field sensor does not measure a sufficiently strong magnetic field, it can be established whether the holding arm was (deliberately) brought into the release position, or whether the permanent magnet was (inadvertently) heated above its first or second limiting temperature.

The second magnetic field sensor is typically configured for measuring a strength of a magnetic field. Alternatively or additionally, the second magnetic field sensor can be configured for measuring a chronological and/or spatial gradient of the strength of a magnetic field. The second magnetic field sensor can be configured as a Hall sensor. The second magnetic field sensor can utilize a magnetoresistive effect. The second magnetic field sensor can be an inductive sensor.

The first and/or the second magnetic field sensor can have multiple subsensors. Spatial gradients of the magnetic field generated by the permanent magnet can be detected using such magnetic field sensors. The subsensors can be disposed in a matrix structure, in particular having at least one column and at least two lines of subsensors. The at least two lines are typically disposed so that the permanent magnet passes over several of the lines when the holding arm is moved between the closure position and the release position.

With the objects of the invention in view, there is also provided a laser arrangement having a laser light source for generating a laser beam and having an above-described beam shutter according to the invention disposed in the beam path of the laser beam. The laser light source can have a laser power of at least 100 W, in particular at least 1 kW. The laser beam is incident in the closure position of the holding arm on the reflecting optical unit. The advantages of the beam shutter according to the invention can be made usable in such a laser arrangement. In particular, it is particularly important in the case of great laser powers that the laser beam can be reliably interrupted. The beam shutter according to the invention is capable of performing this.

A safety logic of an existing laser arrangement typically does not have to be adjusted upon use of the beam shutter according to the invention. Therefore, an existing truth table in the state diagram for the beam shutter remains valid. The truth table can in particular describe states in which the laser beam has to be interrupted by the beam shutter, for example when a safety circuit of the laser arrangement is interrupted or opened.

The safety logic of the laser arrangement or the beam shutter is typically constructed so that an absence of the signal at the first magnetic field sensor due to the permanent magnet which is fixed on the holding arm results in switching off of the laser, unless regular operation takes place (holding arm in release position, safety circuit closed). If the beam shutter is opened (holding arm in release position) and laser light is emitted, the magnet fixed on the holding arm thus moves away from the first magnetic field sensor and its signal decreases. If the beam shutter is closed (holding arm in closure position), the proximity of permanent magnet and first magnetic field sensor is detected. If the permanent magnet is heated above the first limiting temperature, in particular above the second limiting temperature, the (spontaneous or directed) magnetization of crystal regions disappears and the first magnetic field sensor establishes a signal drop. The laser can thereupon be switched off, even before the holding arm is melted or perforated by the laser. A loss of the permanent magnet or a failure of the first magnetic field sensor also does not represent a hazardous state, since an absence of signal always (exception: regular operation) prevents switching on of the laser light source.

The laser arrangement typically also includes an absorber on which the laser beam is deflected by the reflecting optical unit when the holding arm is located in the closure position.

It can be provided that the holding arm of a beam shutter according to the invention flatly reaches behind the reflecting optical unit. The holding arm therefore—viewed from the direction of a laser beam of the laser arrangement incident on the reflecting optical unit—has a flat section disposed behind the reflecting optical unit. In other words, the holding arm blocks the beam path of the laser beam in the closure position even if the reflecting optical unit is absent.

The holding arm of the beam shutter is particularly preferably configured so that if the reflecting optical unit is absent, it withstands a direct incidence of the laser beam until the permanent magnet has been heated above the first limiting temperature, in particular above the second limiting temperature. It can thus be ensured that even without the reflecting optical unit, the laser beam can be securely interrupted or stopped by the beam shutter.

With the objects of the invention in view, there is furthermore provided a method for operating an above-described laser arrangement according to the invention. The method comprises the following steps:

a) bringing the holding arm into the closure position,
b) operating the laser light source and measuring a strength and/or a gradient of a magnetic field using the first magnetic field sensor, and
c) switching off the laser light source when the magnetic field measured by the first magnetic field sensor decreases.

The laser light source emits a laser beam in operation. The operation of the laser light source can have begun before carrying out step a). It is ensured by step a) that the laser beam cannot pass the beam shutter. It is monitored by the measurement of the strength and/or the gradient of the magnetic field using the first magnetic field sensor whether the beam shutter is still in a state in which it can securely stop the laser beam. When the magnetic field measured by the first magnetic field sensor decreases, it is to be presumed that the laser beam is no longer stopped or can no longer be stopped by the beam shutter. The laser light source is therefore switched off, wherein switching off the laser light source can be dependent on further conditions. The method according to the invention permits operation of the laser arrangement according to the invention with increased security. In particular, in this way operation of the laser light source can be ended before the holding arm can no longer stop the laser beam in case of a loss of the reflecting optical unit.

In step b), the permanent magnet can be heated above the first limiting temperature, in particular above the second limiting temperature. Upon exceeding of the first limiting temperature, the magnetization of the permanent magnet decreases and it disappears completely upon exceeding of the second limiting temperature, so that a thermal overload of the holding arm, on which the permanent magnet is fastened, can be concluded. The second limiting temperature is typically a Curie temperature of the permanent magnet.

The first magnetic field sensor preferably measures the time curve of a strength and/or a gradient (of the strength) of a magnetic field in step b). A decrease of the magnetic field triggering the switching off in step c) is recognized in that the magnetic field measured by the first magnetic field sensor passes a predetermined threshold value with respect to the strength and/or the gradient of the magnetic field. In other words, the laser light source can be switched off when upon a decrease of the magnetic field measured by the first magnetic field sensor, a predetermined threshold value with respect to the strength and/or the gradient of the magnetic field is passed.

The threshold value with respect to the strength can be defined relative to the non-reduced (previously measured maximum) strength of the magnetic field. The switching off can take place in this case when the strength of the magnetic field has decreased by more than the threshold value. Alternatively, the threshold value can be defined absolutely with respect to the strength. The switching off can take place in this case when the strength of the magnetic field falls below the threshold value.

The gradient can be a spatial or a chronological gradient. The gradient can also be a chronological gradient of a spatial gradient of the strength of the magnetic field. The threshold value with respect to the spatial gradient can be defined relative to the original spatial gradient or absolutely. In the case of a relatively defined threshold value for the spatial gradient, the switching off can take place when the spatial gradient has decreased (in absolute value) by more than the threshold value. In the case of an absolutely defined threshold value for the spatial gradient, the switching off can take place when the spatial gradient falls below the threshold value, in particular in absolute value. The threshold value for one of the chronological gradients is typically absolutely defined.

A further threshold value can be established in each case so that the switching off only takes place when the observed measured variable (strength of the magnetic field or one of the gradients) is in a range between the threshold values. A further threshold value can be provided in particular for a chronological gradient.

In order to establish a decrease of the magnetic field triggering the switching off, it can be checked whether individual or multiple of the above-mentioned threshold values have been passed (exceeded or fallen below depending on the threshold value). In other words, the switching off can be made dependent on multiple conditions, of which all or at least a specific number have to be met.

It can be provided that the laser light source is only switched off when the decrease of the strength of the magnetic field corresponds in its time curve to a thermally related demagnetization of the permanent magnet. Bringing the holding arm into the release position results in a decrease of the magnetic field detected by the first magnetic field sensor which is different in its time curve. In particular a chronological gradient and/or the final value of the strength of the magnetic field can differ. A (deliberate) opening of the beam shutter can therefore be distinguished from an (inadvertent) burning through of the holding arm with overheating of the permanent magnet, since the time curves of the strength of the magnetic field characteristic in each case for this purpose differ.

A second magnetic field sensor is particularly preferably disposed on the main body of the beam shutter of the laser arrangement, wherein in the release position of the holding arm, the permanent magnet is disposed closer to the second magnetic field sensor than in the closure position of the holding arm. It can be provided that the laser light source is only switched off when the strength of a magnetic field measured by the second magnetic field sensor does not increase. An increase of the strength of the magnetic field measured by the second magnetic field sensor signals a deliberate opening of the beam shutter (bringing the holding arm into the release position). Switching off the laser light source is not required in this case.

Further advantages and advantageous embodiments of the subject matter of the invention result from the description, the claims, and the drawing. The above-mentioned features and the features set forth hereinafter can each be used as such or in a plurality in arbitrary combinations. The embodiments shown and described are not to be understood as an exhaustive list, but rather have exemplary character for the description of the invention.

Other features which are considered as characteristic for the invention are set forth in the appended claims.

Although the invention is illustrated and described herein as embodied in a beam shutter, a laser arrangement and an associated operating method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
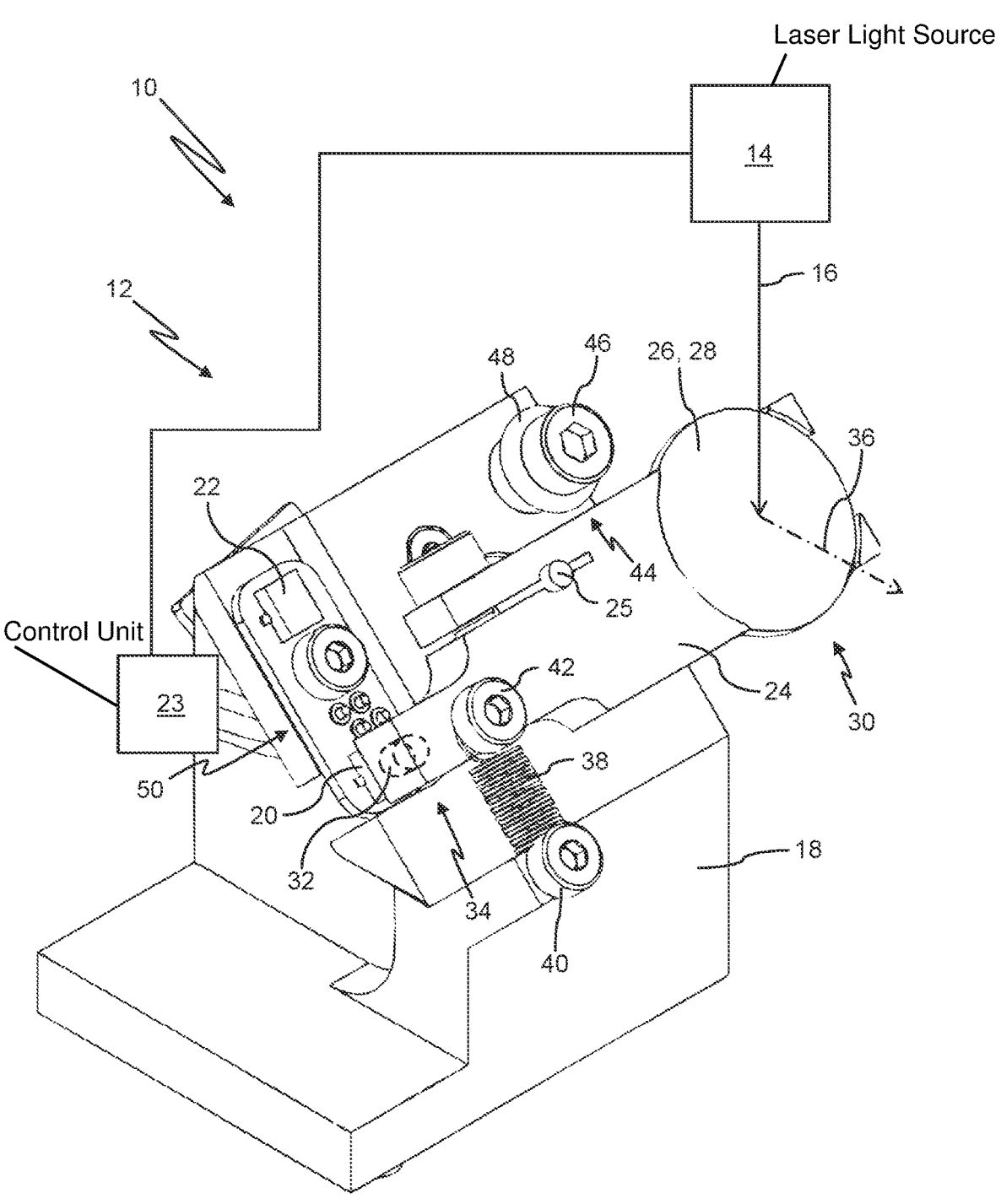
FIG. 1 is a diagrammatic, perspective view of a laser arrangement having a beam shutter, wherein a holding arm having a reflecting optical unit is folded into the beam path of a laser beam in a closure position.

Referring now to the figures of the drawings in detail and first, particularly, to FIG. 1 thereof, there is seen a laser arrangement 10 according to the invention. The laser arrangement 10 includes a beam shutter 12 according to the invention and a laser light source 14. The laser light source 14 emits a laser beam 16 in operation.

The beam shutter 12 has a main body 18. A first magnetic field sensor 20 is disposed on the main body 18. Furthermore, a second magnetic field sensor 22 is disposed on the main body 18. The two magnetic field sensors 20, 22 are each configured as a Hall sensor in this case. The magnetic field sensors 20, 22 each measure the strength of a magnetic field acting thereon in operation. The measurement result is transmitted to a control unit 23 of the laser arrangement 10.

The beam shutter 12 has a holding arm 24. The holding arm 24 can be formed of CuCr1Zr. The holding arm 24 is movably mounted relative to the main body 18. The holding arm 24 is fastened in this case on an output shaft 25 of a stepping motor (not shown) disposed in the main body 18. The holding arm 24 is shown in a closure position in FIG. 1. The holding arm 24 can be transferred into a release position shown in FIG. 2 by rotation through the use of the stepping motor.

A reflecting optical unit 26 is disposed on the holding arm 24. The reflecting optical unit 26 includes a mirror 28 in this case. The mirror 28 is adhesively bonded to the holding arm 24 in a first end region 30 of the holding arm 24. The holding arm 24 reaches flatly behind the reflecting optical unit 26. In other words, a continuous flat section (concealed) of the holding arm 24 is formed behind the mirror 28.

A permanent magnet 32 is disposed on the holding arm 24. The permanent magnet 32 is fastened on the holding arm 24 spaced apart from the reflecting optical unit 26 in a second end region 34 opposite to the first end region 30. An axis of rotation (cf. output shaft 25) of the holding arm 24 extends between the reflecting optical unit 26 and the permanent magnet 32. The permanent magnet 32 generates a magnetic field. Upon heating of the permanent magnet 32 above a first limiting temperature, a strength of the magnetic field decreases. In particular, upon heating of the permanent magnet 32 above a second limiting temperature, which is its Curie temperature in this case, the magnetic field generated thereby disappears completely. The Curie temperature of the permanent magnet is more than 400 K below the melting temperature of the holding arm 24 in this case.

In the closure position of the holding arm 24 shown in FIG. 1, the permanent magnet 32 is disposed in direct proximity to the first magnetic field sensor 20. The permanent magnet 32 is significantly farther away from the second magnetic field sensor 22 in the closure position.

Figure 2:
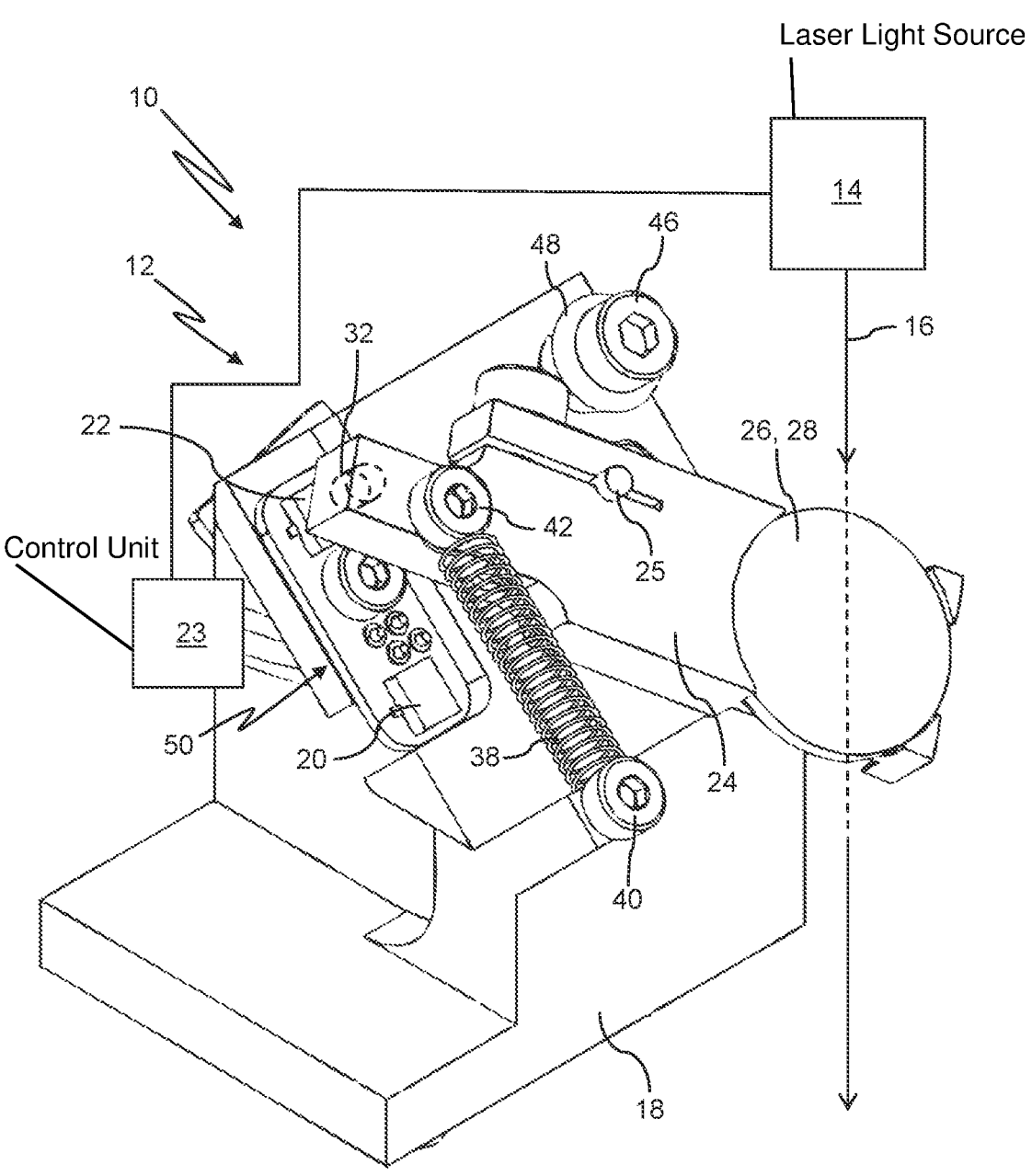
FIG. 2 is a perspective view of the laser arrangement of FIG. 1, wherein the holding arm is brought into a release position so that the laser beam is not incident on the reflecting optical unit.

In the release position of the holding arm 24 shown in FIG. 2, the permanent magnet 32 is disposed in direct proximity to the second magnetic field sensor 22. The permanent magnet 32 is significantly farther away from the first magnetic field sensor 20 in the release position.

The respective magnetic field sensor 20 or 22 located close to the permanent magnet 32 detects the magnetic field generated by the permanent magnet 32, if the permanent magnet 32 was not overheated. It can therefore be established on the basis of the sensor signals of the magnetic field sensors 20, 22 whether the holding arm 24 is in the closure position or in the release position.

If the permanent magnet 32 is heated above its first limiting temperature, in particular above its second limiting temperature, the magnetic field sensors 20, 22 detect only a weak magnetic field or none at all. This information permits the conclusion that the permanent magnet 32 and also the holding arm 24 are overheated. The laser light source 14 then has to be switched off for safety reasons.

In the closure position of the holding arm 24 (cf. FIG. 1), the laser beam 16 is incident on the reflecting optical unit 26. It is deflected by the reflecting optical unit 26 to an absorber (not shown), cf. dot-dash arrow 36. In other words, the holding arm 24 having the reflecting optical unit 26 is disposed in the beam path of the laser beam 16.

The holding arm 24 is configured in this case so that it also withstands the incidence of the laser beam 16 and interrupts it if the reflecting optical unit 26 would be damaged for any reason, in particular when the mirror 28 would have detached from the holding arm 24. The holding arm 24 withstands the laser beam 16 until the permanent magnet 32 has been heated above the first limiting temperature, in particular above the second limiting temperature. The materials of the holding arm 24 and the permanent magnet 32 are selected so that up to this point in time, the holding arm 24 has not been heated up to its melting temperature. The defect of the reflecting optical unit 26 can thus be detected by evaluating the signals of the magnetic field sensors 20, 22, in particular by evaluating the signal of the first magnetic field sensor 20, before an inadvertent escape of the laser beam 16 from the laser arrangement 10 can occur. The laser light source 14 is automatically switched off upon establishing the defect.

In the release position (cf. FIG. 2), the holding arm 24 having the reflecting optical unit 26 is disposed outside the beam path of the laser light source 14. The laser beam 16 runs past behind the holding arm 24 in the illustrated configuration (cf. dashed section of the laser beam 16), so that it can escape downward from the laser arrangement 10. In the release position of the holding arm 24, for example, processing of a workpiece can be carried out using the laser beam 16.

The holding arm 24 is pre-tensioned into the closure position in the case of the illustrated beam shutter 12. For this purpose, a spring 38 is fastened on the main body 18 or the holding arm 24, for example using screws 40, 42. When the holding arm 24 is brought into the release position, the spring 38 is lengthened, so that it has a restoring effect on the holding arm 24 in the direction of the closure position.

A stop 44 for the holding arm 24 is provided on the main body 18 in this case. The stop 44 prevents pivoting of the holding arm 24 beyond the closure position. The stop 44 is formed in this case by a further screw 46 having a rubber ring 48 disposed thereon.

Figure 3:
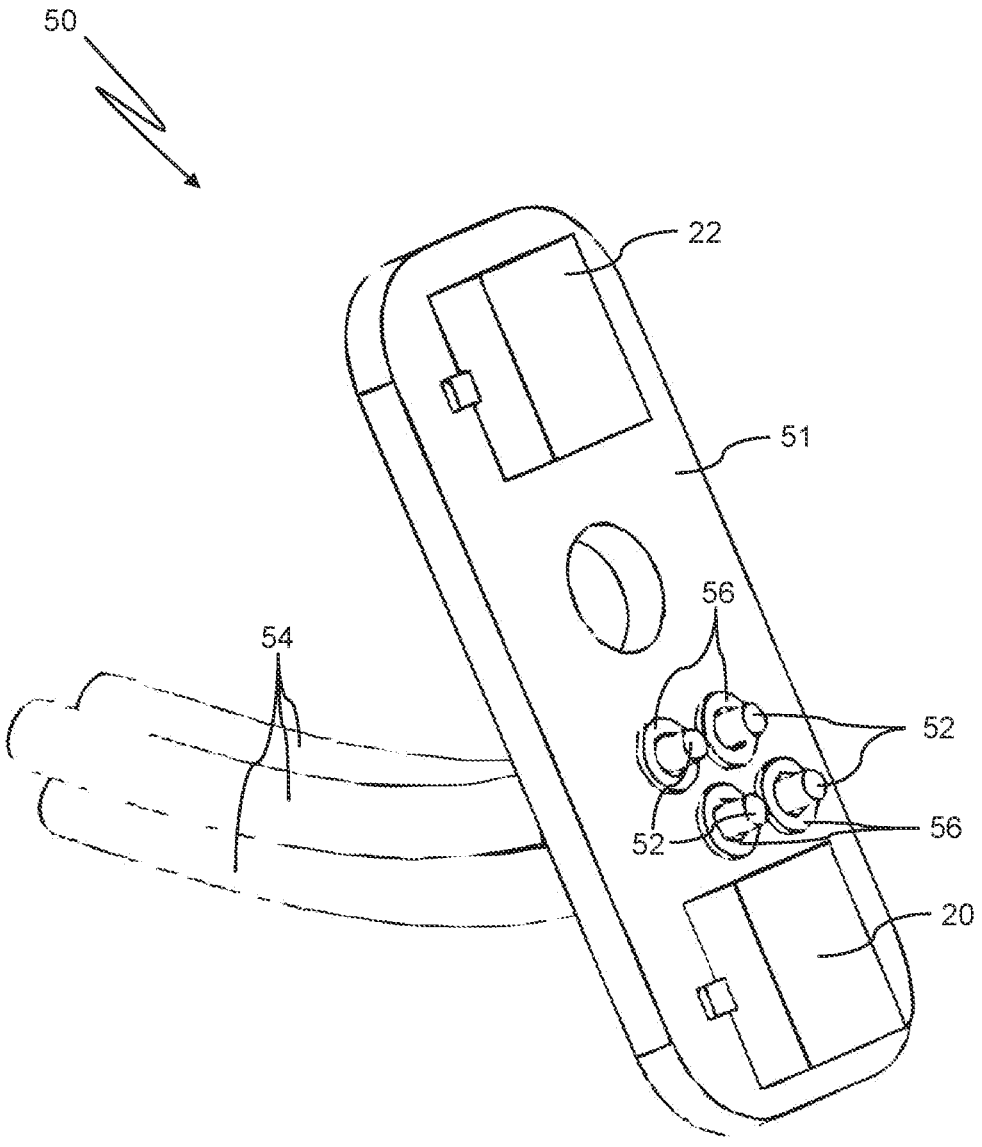
FIG. 3 is a perspective view of a sensor assembly having two magnetic field sensors of the beam shutter of the laser arrangement according to FIGS. 1 and 2.

FIG. 3 shows a sensor assembly 50 of the beam shutter 12 of FIGS. 1 and 2. The sensor assembly 50 includes the two magnetic field sensors 20, 22, which are disposed on a shared circuit board 51. In order to transmit the signals of the two magnetic field sensors 20, 22, conductors 52 of four cables 54 are inserted from the rear through ring-shaped solder contacts 56 of the circuit board 51 and soldered in a way not shown in greater detail from the front with the solder contacts 56. Each two of the solder contacts 56 are connected in a way which is not shown by conductor tracks inside the circuit board 51 to one of the magnetic field sensors 20 or 22 in each case. The sensor assembly 50 is screwed onto the main body 18 of the beam shutter 12, cf. FIGS. 1 and 2.

Figure 4:
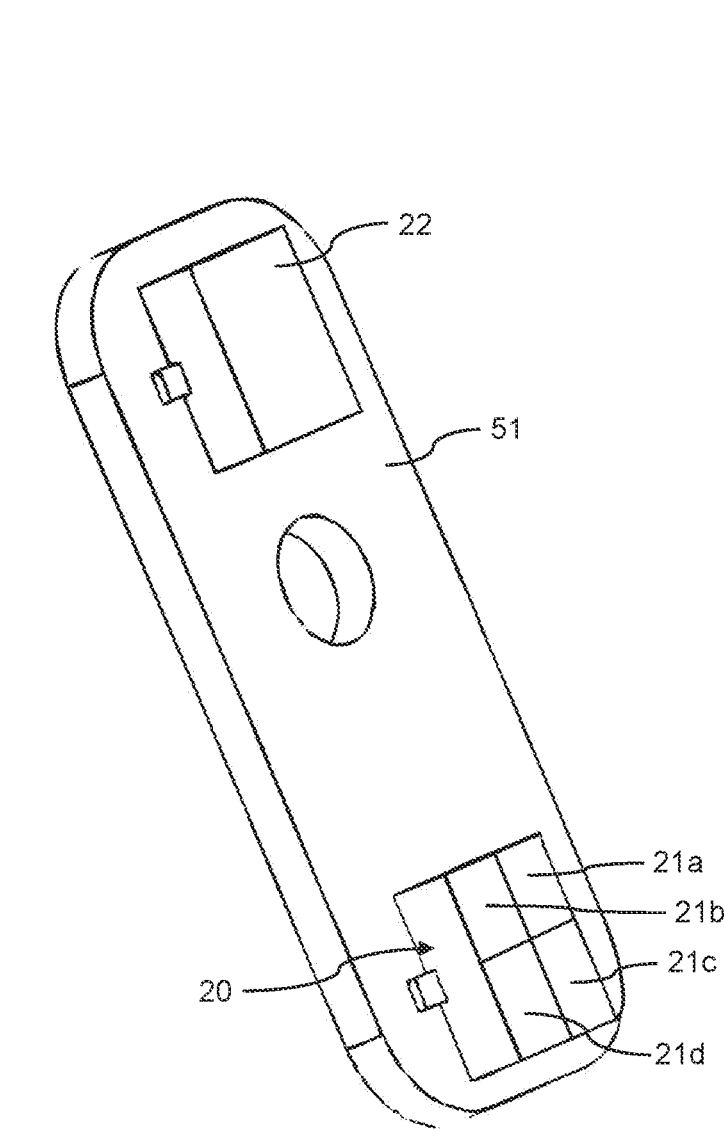
FIG. 4 is a perspective view of a sensor assembly, in which a first magnetic field sensor includes four subsensors.

FIG. 4 shows an alternative structure of a sensor assembly 50 for the beam shutter 12. The first magnetic field sensor 20 is configured in this sensor assembly 50 as a sensor array having multiple, four in this case, subsensors 21a-21d. The subsensors 21a-21d enable a spatial gradient of a magnetic field to be detected. The four subsensors 21a-21d are disposed in a matrix structure of two lines (having the subsensors 21a and 21b in the first line and the subsensors 21c and 21d in the second line) and two columns (having the subsensors 21a and 21c in the first column and the subsensors 21b and 21d in the second column). In particular more than two lines could also be provided. During a movement of the permanent magnet 32 from the closure position into the release position, cf. FIGS. 1 and 2, the permanent magnet 32 moves in relation to the subsensors 21a-21d in different ways, so that a movement of the permanent magnet 32 can be distinguished from a demagnetization of the permanent magnet 32 via the signal curve at the individual subsensors 21a-21d.

The second magnetic field sensor 22 could also have multiple subsensors (not shown in greater detail).

Figure 5:
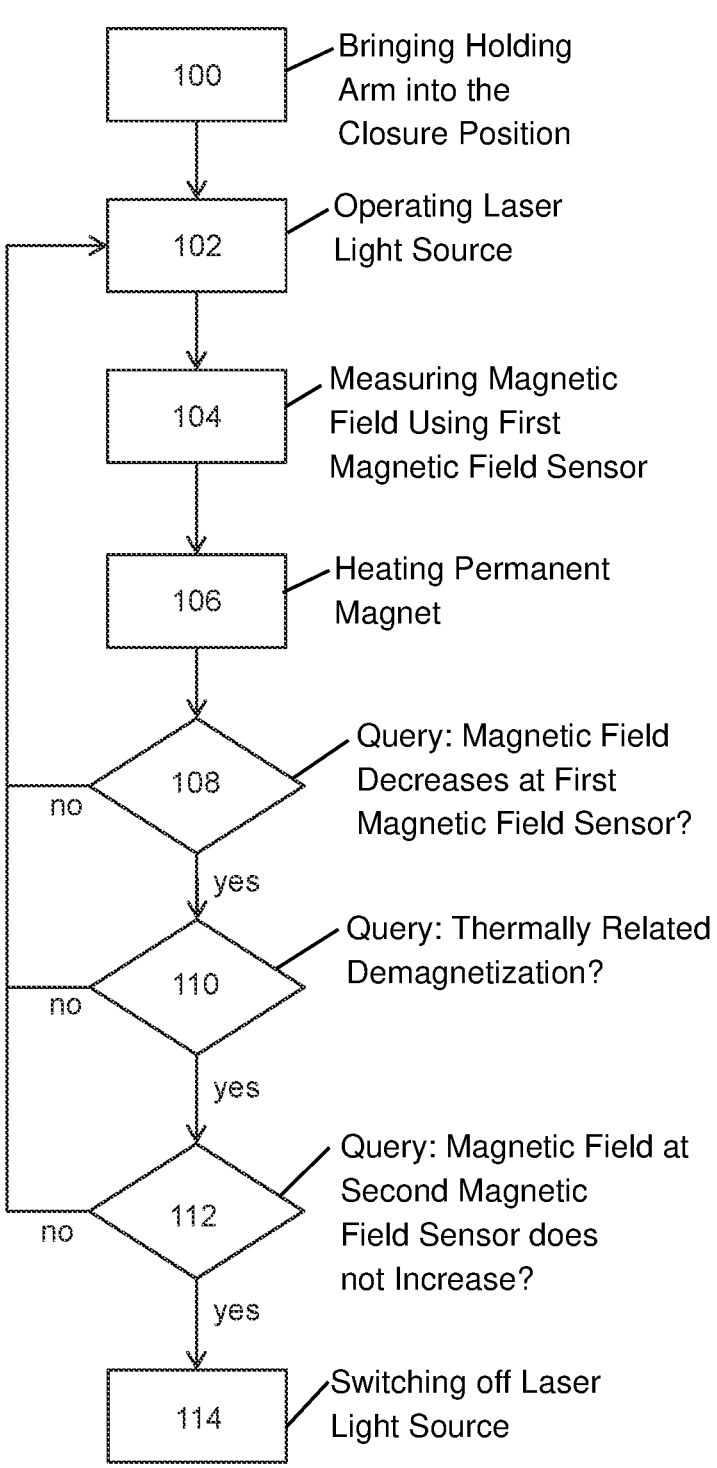
FIG. 5 is a flow chart of an operating method for a laser arrangement.

FIG. 5 shows a flow chart of an operating method according to the invention for the laser arrangement 10 of FIGS. 1 and 2.

In a step 100, the holding arm 24 of the beam shutter 12 is brought into the closure position (cf. FIG. 1). While the holding arm 24 is in the closure position, the laser light source 14 is operated (step 102), so that it emits the laser beam 16. The operation of the laser light source 14 can have begun before carrying out step 100. During the operation 102 of the laser light source 14, the strength and optionally a chronological gradient of the magnetic field generated by the permanent magnet 32 is measured by the first magnetic field sensor 20 (step 104). The measurement of the strength and possibly the chronological gradient of the magnetic field can take place in short time intervals or preferably continuously.

It is assumed hereinafter that the reflecting optical unit 26 has detached from the holding arm 24, so that the laser beam 16 is incident directly on the holding arm 24. The holding arm 24 is thus heated. The holding arm 24 transmits the heat to the permanent magnet 32, so that this is also heated (step 106). Upon sufficiently long action of the laser beam 16 having corresponding power on the holding arm 24, the permanent magnet 32 is heated to above the first limiting temperature, in particular above the second limiting temperature. The strength of the magnetic field generated by the permanent magnet 32 decreases due to this overheating of the permanent magnet 32. The decrease of the magnetic field is detected by the first magnetic field sensor 20.

The operating method provides a query 108 as to whether the magnetic field measured by the first magnetic field sensor 20 has decreased. If not, the beam shutter 12 is still in a safe state (holding arm 24 in closure position and not overheated), so that the laser light source 14 can be operated further.

It was assumed in the described example that the magnetic field has decreased at the first magnetic field sensor 20. The control unit 23 recognizes from the speed of the decrease that it is a thermally related demagnetization of the permanent magnet 32. The speed of the decrease of the strength of the magnetic field can be detected through the use of a chronological gradient. The control unit 23 establishes simultaneously that the magnetic field detected by the second magnetic field sensor 22 does not increase. The operating method provides queries 110 and 112 for these two conditions. If both conditions 110, 112 are met, the control unit 23 switches off the laser light source 14 in a step 114. Otherwise, the laser light source 14 can be operated further since the holding arm 24 was deliberately brought into the release position.

It is to be noted that in variants of the method, only one of the two conditions 110 or 112 could also be queried. In particular, in the case of a beam shutter 12 having two magnetic field sensors 20, 22, the more demanding evaluation of the time curve of the signal of the first magnetic field sensor 20 can be dispensed with in favor of the more robust query of the second magnetic field sensor 22. Alternatively, the second magnetic field sensor 22 could be dispensed with and the burning through or bringing into the release position of the holding arm 24 could be concluded only from the time curve of the signal of the first magnetic field sensor 20.

The following is a summary list of reference numerals and the corresponding structure used in the above description of the invention.

LIST OF REFERENCE SIGNS laser arrangement 10
beam shutter 12 laser light source 14
laser beam 16
main body 18
first magnetic field sensor 20
subsensors 21a-21d
second magnetic field sensor 22
control unit 23
holding arm 24
output shaft 25
reflecting optical unit 26
mirror 28
first end region 30
permanent magnet 32
second end region 34
arrow 36
spring 38
screws 40, 42
stop 44
screw 46
rubber ring 48
sensor assembly 50
circuit board 51
conductors 52
cable 54
solder contacts 56
bringing 100 the holding arm 24 into the closure position
operating 102 the laser light source 14
measuring 104 a magnetic field using the first magnetic field sensor 20
heating 106 the permanent magnet 32
query 108: magnetic field decreases at the first magnetic field sensor 20?
query 110: thermally related demagnetization?
query 112: magnetic field at the second magnetic field sensor 22 does not increase?
switching off 114 the laser light source 14

The invention claimed is:

1. A beam shutter for a laser beam, the beam shutter comprising:
   a main body;
   a first magnetic field sensor disposed on said main body;
   a holding arm configured to be brought into a release position and a closure position relative to said main body;
   a reflecting optical unit disposed on said holding arm for deflecting the laser beam;
   a permanent magnet disposed on said holding arm for generating a magnetic field having a strength decreasing upon heating of said permanent magnet above a first limiting temperature;
   said permanent magnet being disposed closer to said first magnetic field sensor in said closure position of said holding arm than in said release position of said holding arm; and
   a control unit configured to switch off a laser light source upon a decrease in the magnetic field measured by said first magnetic field sensor and passing of a predetermined threshold value with respect to at least one of a strength or a gradient of the magnetic field.

2. The beam shutter according to claim 1, wherein the magnetic field completely disappears upon heating of said permanent magnet above a second limiting temperature.

3. The beam shutter according to claim 2, wherein said second limiting temperature is a Curie temperature of said permanent magnet.

4. The beam shutter according to claim 2, wherein said second limiting temperature of said permanent magnet is below a melting temperature of a material of said holding arm.

5. The beam shutter according to claim 4, wherein said second limiting temperature is at least 200 K.

6. The beam shutter according to claim 4, wherein said second limiting temperature is at least 300 K.

7. The beam shutter according to claim 4, wherein said second limiting temperature is at least 400 K.

8. The beam shutter according to claim 1, wherein said holding arm is formed of CuCr1Zr.

9. The beam shutter according to claim 1, wherein said holding arm is pre-tensioned into said closure position.

10. The beam shutter according to claim 1, wherein said holding arm is rotatably mounted on said main body.

11. The beam shutter according to claim 1, wherein said reflecting optical unit has a mirror.

12. The beam shutter according to claim 11, wherein said mirror is adhesively bonded to said holding arm.

13. The beam shutter according to claim 1, wherein said first magnetic field sensor is a Hall sensor.

14. The beam shutter according to claim 1, which further comprises a second magnetic field sensor disposed on said main body, said permanent magnet being disposed closer to said second magnetic field sensor in said release position of said holding arm than in said closure position of said holding arm.

15. A laser arrangement, comprising:

a laser light source for generating a laser beam having a beam path; and a beam shutter according to claim 1 disposed in said beam path of said laser beam;

said laser beam being incident on said reflecting optical unit in said closure position of said holding arm.

16. The laser arrangement according to claim 15, wherein:

said permanent magnet has a second limiting temperature;

said holding arm of said beam shutter reaches flatly behind said reflecting optical unit; and said holding arm of said beam shutter is configured to withstand a direct incidence of said laser beam, when said reflecting optical unit is absent, until said permanent magnet has been heated above said first limiting temperature or above said second limiting temperature.

17. A method for operating a laser arrangement, the method comprising:

providing the laser arrangement according to claim 15;

a) bringing said holding arm into said closure position;

b) operating said laser light source and measuring at least one of a strength or a gradient of a magnetic field using said first magnetic field sensor; and c) switching off said laser light source when the magnetic field measured by said first magnetic field sensor decreases and a predetermined threshold value with respect to at least one of the strength or the gradient of the magnetic field is passed.

18. A method for operating a laser arrangement, the method comprising:

providing the laser arrangement according to claim 16;

a) bringing said holding arm into said closure position;

b) operating said laser light source and measuring at least one of a strength or a gradient of a magnetic field using said first magnetic field sensor; and c) switching off said laser light source when the magnetic field measured by said first magnetic field sensor decreases and a predetermined threshold value with respect to at least one of the strength or the gradient of the magnetic field is passed.

19. The method according to claim 17, which further comprises heating said permanent magnet above said first limiting temperature or above said second limiting temperature in step b).

20. The method according to claim 17, which further comprises switching off said laser light source only when the decrease of the strength of the magnetic field has a time curve corresponding to a thermally related demagnetization of said permanent magnet.

21. The method according to claim 17, which further comprises:

providing said beam shutter with a second magnetic field sensor disposed on said main body;

placing said permanent magnet closer to said second magnetic field sensor in said release position of said holding arm than in said closure position of said holding arm; and switching off said laser light source only when the strength of a magnetic field measured by said second magnetic field sensor does not increase.

\* \* \* \* \*